(12) United States Patent
Cartier et al.

(10) Patent No.: US 9,275,744 B1
(45) Date of Patent: Mar. 1, 2016

(54) METHOD OF RESTORING A FLASH MEMORY IN AN INTEGRATED CIRCUIT CHIP PACKAGE BY ADDITION OF HEAT AND AN ELECTRIC FIELD

(71) Applicant: International Business Machines Corporation, Armonk, NY (US)

(72) Inventors: Eduard A. Cartier, New York, NY (US); Jeffrey P. Gambino, Westford, VT (US); Adam J. McPadden, Underhill, VT (US); Gary A. Tressler, Sandy Hook, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/608,243

(22) Filed: Jan. 29, 2015

(51) Int. Cl.
   *G11C 11/34* (2006.01)
   *G11C 16/10* (2006.01)
   *G11C 16/04* (2006.01)

(52) U.S. Cl.
   CPC ............ *G11C 16/10* (2013.01); *G11C 16/0408* (2013.01)

(58) Field of Classification Search
   USPC ............. 365/185.11, 185.17, 185.18, 185.24, 365/185.33
   See application file for complete search history.

(56) References Cited

U.S. PATENT DOCUMENTS

| | | | |
|---|---|---|---|
| 6,115,291 A | 9/2000 | Lakhani | |
| 6,274,465 B1 | 8/2001 | Ballantine et al. | |
| 6,574,143 B2 * | 6/2003 | Nakazato | H01L 21/28273 365/185.18 |
| 6,721,208 B2 | 4/2004 | Jung et al. | |
| 8,247,862 B2 | 8/2012 | Babcock et al. | |
| 8,400,831 B2 | 3/2013 | Cho et al. | |
| 8,824,212 B2 * | 9/2014 | Lue | 365/185.18 |
| 2012/0279952 A1 | 11/2012 | Vanalli et al. | |
| 2013/0126510 A1 | 5/2013 | Oh et al. | |
| 2014/0269004 A1 | 9/2014 | Pramanik et al. | |
| 2014/0273300 A1 | 9/2014 | Pramanik et al. | |

FOREIGN PATENT DOCUMENTS

| | | |
|---|---|---|
| EP | 2 521 135 A1 | 11/2012 |
| JP | 2009-037670 | 2/2009 |

OTHER PUBLICATIONS

Lue et al., "Radically Extending the Cycling Endurance of Flash Memory (to > 100M Cycles) by Using Built-in Thermal Annealing to Self-heal the Stress-induced Damage," IEEE, 2012, pp. 9.1.1-9.1.4.
Nancy Owano, "Taiwan Engineers Defeat Limits of Flash Memory", http://phys.org/news/2012-12-taiwan-defeat-limits-memory.html, Dec. 2, 2012, pp. 1-3.

(Continued)

*Primary Examiner* — Trong Phan
(74) *Attorney, Agent, or Firm* — Gibb & Riley, LLC; Steven Meyers, Esq.

(57) ABSTRACT

A method of enhancing a thermal anneal of a flash memory in an integrated circuit (IC) chip package by addition of an electric field may include heating an integrated circuit (IC) chip, disposed within an IC chip package, to an elevated temperature that does not degrade the IC chip package, where the IC chip includes a flash memory that includes blocks of flash memory cells. A negative electric field may be applied to each of the blocks of flash memory cells at the elevated temperature. The application of the negative electric field and the heating of the IC chip may be terminated. Stored data for each of the blocks of flash memory cells may be retrieved from a storage device and rewritten into each of the blocks of flash memory cells.

20 Claims, 6 Drawing Sheets

(56) References Cited

OTHER PUBLICATIONS http://www.macronix.com, "Program/Erase Cycling Endurance and Data Retention in NOR Flash Memories", P/N: AN0291, Rev. 2, Jun. 12, 2014, pp. 1-6.

Simon Sharwood, "Macronix's 'Thermal Annealing' Process Extends SSD Life from 10k to 100m Read/Write Cycles", Science, Dec. 3, 2012, pages.

Park et al., "Effect of Electric-Field-Assisted Thermal Annealing of Poly(4-vinylphenol) Film on its Dielectric Constant", Appl. Phys. Lett. 92, 103311 (2008); http://dx.doi.org/10.1063/1.2896603, pp. 1-6.

Qi Wu, "A First Study on Self-Healing Solid-State Drives", Memory Workshop (IMW), 2011 3rd IEEE International, pp. 1-4.

* cited by examiner

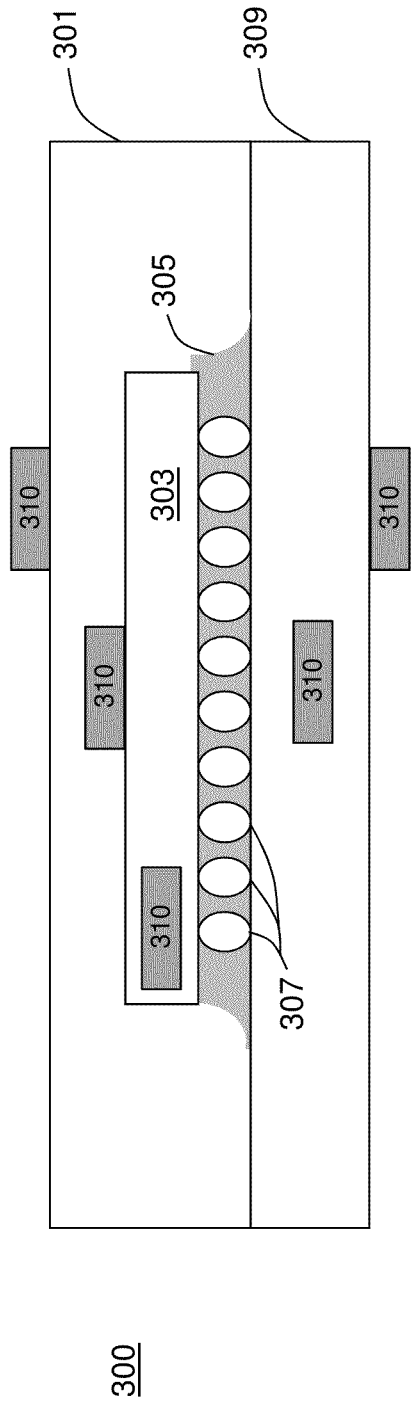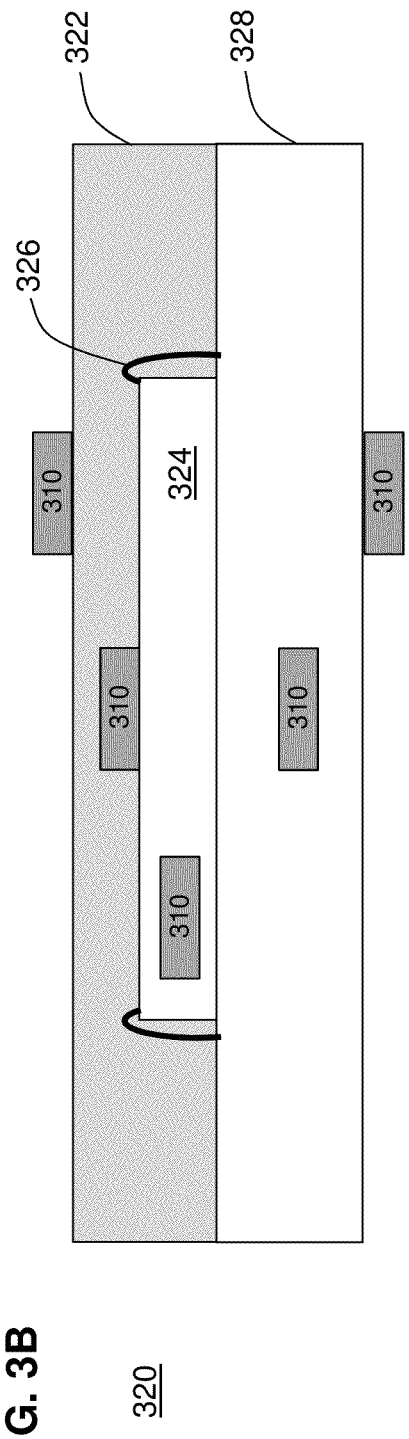
FIG. 3A
FIG. 3B

METHOD OF RESTORING A FLASH MEMORY IN AN INTEGRATED CIRCUIT CHIP PACKAGE BY ADDITION OF HEAT AND AN ELECTRIC FIELD

BACKGROUND

The present disclosure relates to methods of enhancing a thermal anneal of a flash memory in an integrated circuit (IC) chip package by addition of an electric field. Specifically, the present disclosure relates to a method of recovering a voltage threshold of a flash memory cell that has undergone many program/erase (P/E) cycles by simultaneously heating and applying an electric field to a tunnel dielectric layer of the flash memory cell, to release charge trapped within the tunnel dielectric layer, effecting a field effect transistor threshold voltage shift.

Flash memory is a class of non-volatile integrated circuit memory technology. Referring to FIG. 1, a flash memory cell 100 comprises a field effect transistor (FET) having a source 102 and drain 104 separated by a channel 105 in a doped silicon substrate 101, and two gates 107, 109. A metal layer 110 that connects the various flash memory cells is disposed distally to the control gate 109, relative to the silicon substrate 101. A control gate 109 is separated from the channel 105 by a blocking dielectric layer 108, a floating gate 107, and a tunnel dielectric layer 106. The floating gate 107 may comprise polysilicon that is completely isolated by the silicon oxides of the blocking dielectric layer 108 and the tunnel dielectric layer 106. Alternatively, the floating gate 107 may form a charge storage layer in a SONOS device, where the source 102, drain 104, and channel 105 are formed in a silicon substrate (S) 101, the tunnel dielectric layer 106 is formed of silicon oxide (0), the charge storage layer is formed of silicon nitride (N), the blocking dielectric layer 108 is formed of silicon oxide (0), and the control gate 109 is formed of polysilicon (S).

A flash memory cell uses the floating gate or charge storage layer to store an information bit, according to the presence or absence of charge. If the floating gate or charge storage layer is not charged, then the device operates like a FET, i.e., a positive charge in the control gate creates a channel in a p-type doped silicon substrate that carries current from the source to the drain. If, however, the floating gate or charge storage layer is negatively charged, then this charge shields the channel region from the electric field of the control gate and inhibits the formation of a channel between the source and drain. The threshold voltage is the voltage applied to the control gate at which the transistor becomes conductive. The presence or absence of a negative charge on the floating gate or charge storage layer results in a more positive or negative threshold voltage, respectively.

In flash memory, programming a flash memory cell requires putting electrons onto the floating gate or charge storage layer, which is associated with a bit value of 0, while erasing or removing electrons from the floating gate or charge storage layer results in re-setting the flash memory cell to a bit value of 1. Typically, the tunnel dielectric layer of a flash memory cell is impermeable to low energy electrons, but can pass high-energy electrons.

To effect programming of a flash memory cell, channel hot electron (CHE) injection applies a lower positive voltage to the drain of a p-type doped semiconductor substrate to activate "hot electrons" in the channel, respective to the grounded source, and then also applies a higher positive voltage to the control gate, to attract the "hot electrons" to the floating gate or charge storage layer through the tunnel dielectric layer.

Erasing a flash memory cell requires application of a large negative voltage, e.g., −15V, between the control gate and the grounded source of the p-type doped semiconductor substrate or the grounded substrate, itself, to pull electrons from the floating gate or charge storage layer by quantum tunneling through the tunnel dielectric to the grounded source or semiconductor substrate. Typically, erasing can only be performed on a block-wise basis, i.e., all the flash memory cells of an addressable block of flash memory cells are erased together.

Fowler-Nordheim (F-N) tunneling is a quantum-mechanical process whereby a particle, e.g., an electron, can pass through a classically forbidden region such as the tunnel dielectric layer of the flash memory cell. To use the Fowler-Nordheim effect, a strong electric field must be applied across the forbidden region. In a flash memory cell, the increased strength of the electric field applied across the tunnel dielectric layer may be achieved by using a relatively thin dielectric layer with a voltage of, for example, 5-20 V, where electric field strength is measured in volts per meter. When the applied voltage of the control gate is positive to that of the doped silicon substrate, electrons may move from the silicon substrate through the thin layer of the tunnel dielectric into the floating gate or charge storage layer to program the flash memory cell.

Due to the strong electric fields used in program/erase (P/E) cycles of flash memory, the tunnel dielectric layer beneath the floating gate or charge storage layer may become degraded over time. It is well known that charge traps are created in oxides of the dielectric leading to a reduction of endurance capacity and data retention time in a flash memory chip. This limitation to flash memory chips, i.e., charge trapping caused by multiple P/E cycles, is typically measured by a shift in the threshold voltage over a number of P/E cycles. Currently, manufacturers specify for their flash memory chips, a threshold voltage shift per 100,000 P/E cycles, which permits nominal operation.

Until recently, attempts to cure the shift in threshold voltage over multiple P/E cycles by annealing flash memory chips were regarded as impractical because the entire memory chip would need heating for hours at around 250° C. However, by redesigning the flash memory chips to include onboard heaters that heat restricted areas of the flash memory chip with a brief pulse of heat, i.e., about 800° C., the flash memory chip can return to a "good" state.

There remains a need to realize the benefits of annealing a flash memory chip at a modest elevated temperature to integrated circuits in the field.

SUMMARY

In view of the foregoing, the disclosure may provide a method of enhancing a thermal anneal of a flash memory in an integrated circuit (IC) chip package by addition of an electric field. The method may include heating an integrated circuit (IC) chip, disposed within an IC chip package, to an elevated temperature, where the IC chip contains a flash memory that includes blocks of flash memory cells and each of the flash memory cells includes a control gate separated from a floating gate, which is separated from a channel region in a semiconductor substrate of a field effect transistor by a tunnel dielectric. The method may also include applying a negative electric field to each of the blocks of flash memory cells at the elevated temperature, where the electric field causes a trapped negative charge in the tunnel dielectric to quantum tunnel to the channel region, effecting a field effect transistor threshold voltage shift of the flash memory cells. The method may further include terminating application of the negative electric field to each of the blocks of flash memory cells and then terminating the heating of the IC chip. The method may yet further include allowing the IC chip to return to an ambient temperature. Finally, the method may include retrieving stored data for each of the blocks of flash memory cells from a storage device and rewriting the stored data into each of the blocks of flash memory cells.

Another disclosure may also provide a method of enhancing a thermal anneal of a flash memory in an integrated circuit (IC) chip package by addition of an electric field. The method may include copying data from blocks of flash memory cells comprising a flash memory disposed within an integrated circuit (IC) chip, which is disposed within an IC chip package, to a storage device, where each of the flash memory cells includes a control gate separated from a floating gate, which is separated from a channel region in a semiconductor substrate of a field effect transistor by a tunnel dielectric. The method may also include heating the IC chip to an elevated temperature. The method may further include applying a negative electric field to each of the blocks of flash memory cells sequentially over individual blocks of the flash memory for an address space that addresses all functional blocks of the flash memory at the elevated temperature, where the negative electric field causes a trapped negative charge in the tunnel dielectric to quantum tunnel to the channel region, effecting a field effect transistor threshold voltage shift of the flash memory cells. The method may yet further include terminating the application of the negative electric field to each of the blocks of flash memory cells and then terminating the heating of the IC chip. The method may yet further include allowing the IC chip to return to an ambient temperature. Finally, the method may include retrieving stored data for each of the blocks of flash memory cells from the storage device and rewriting the stored data into each of the blocks of flash memory cells.

Yet another disclosure may also provide a method of enhancing a thermal anneal of a flash memory in an integrated circuit (IC) chip package by addition of an electric field. The method may include copying data from blocks of flash memory cells comprising a flash memory disposed within an integrated circuit (IC) chip, which is disposed within an IC chip package, to a storage device, where each of the flash memory cells includes a control gate separated from a floating gate, which is separated from a channel region in a semiconductor substrate of a field effect transistor by a tunnel dielectric. The method may also include heating the IC chip to an elevated temperature. The method may further include applying a negative electric field to each of the blocks of flash memory cells simultaneously over individual blocks of the flash memory for an address space that addresses all functional blocks of the flash memory at the elevated temperature, where the negative electric field causes a trapped negative charge in the tunnel dielectric to quantum tunnel to the channel region, effecting a field effect transistor threshold voltage shift of the flash memory cells. The method may yet further include terminating the application of the negative electric field to each of the blocks of flash memory cells and then terminating the heating of the IC chip. The method may yet further include allowing the IC chip to return to an ambient temperature. Finally, the method may include retrieving stored data for each of the blocks of flash memory cells from the storage device and rewriting the stored data into each of the blocks of flash memory cells.

BRIEF DESCRIPTION OF THE DRAWINGS

The embodiments herein will be better understood from the following detailed description with reference to the drawings, which are not necessarily drawn to scale and in which:

FIG. 3A is a schematic illustrating possible dispositions of resistive heaters in a flip chip package of embodiments herein;

FIG. 3B is a schematic illustrating possible dispositions of resistive heaters in a wire bond package of embodiments herein;

DETAILED DESCRIPTION

Figure 1:
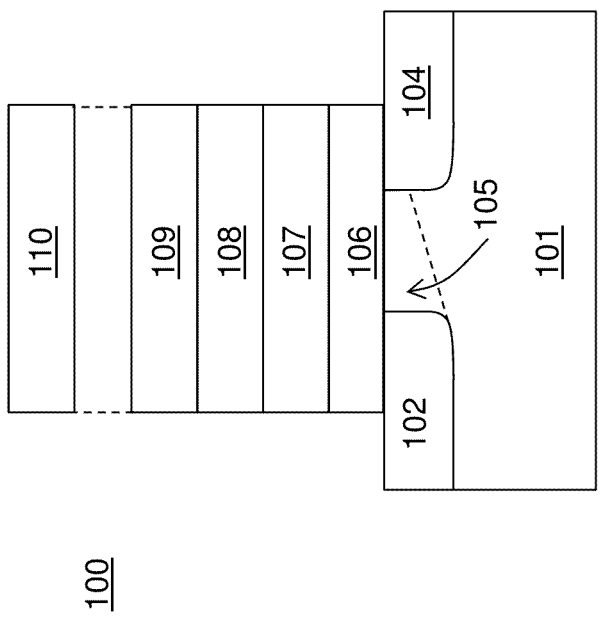
FIG. 1 is a schematic diagram illustrating the structure of a flash memory cell in the prior art.

The exemplary aspects of the disclosure and its various features and advantageous details are explained more fully with reference to the non-limiting exemplary aspects that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary methods, systems, and products of the disclosure. The examples used herein are intended to merely facilitate an understanding of ways in which the exemplary aspects of the disclosure may be practiced and to further enable those of skill in the art to practice the exemplary aspects of the disclosure. Accordingly, the examples should not be construed as limiting the scope of the exemplary aspects of the disclosure.

As stated above, the disclosure may provide a method for realizing the benefits of annealing a flash memory chip at a modest elevated temperature to integrated circuits in the field.

Figure 2:
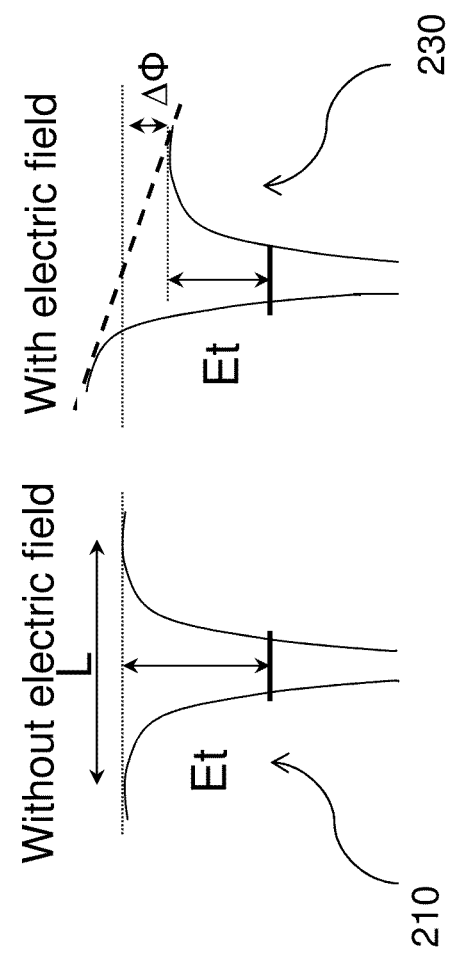
FIG. 2 is a schematic diagram illustrating energy wells for a charge disposed within a dielectric without an applied electric field and with an applied electric according to the Poole-Frenkel effect for embodiments herein.

De-trapping of charges in the tunnel dielectric may occur at temperatures as low as 110° C., while negative voltages typically from −5V to −20V applied across the control gate and relative to the silicon substrate of a flash memory cell may be sufficient to de-trap charges from the tunnel dielectric at a modest elevated temperature. Heating and application of an electric field, however, may act synergistically to enhance Fowler-Nordheim quantum tunneling of a trapped charge through the tunnel dielectric layer of a flash memory cell. Referring to FIG. 2, the schematic 210 illustrates an energy well, where $E_t$ represents the energy required by the trapped charge to escape the charge barrier of the dielectric during an annealing process without an applied electric field. In accordance with the Poole-Frenkel effect, the application of an electric field to the dielectric during annealing results in a reduction to the energy required to escape the charge barrier, $\Delta\Phi$, as shown by the schematic 230.

For example, a calculation of the reduction of the energy barrier by application of an electric field may assume a $\Delta V$ between the control gate and the semiconductor substrate of an FET of a flash memory cell to be 10V and a distance between the control gate and the semiconductor substrate to be 300 Å, resulting in an electric field of 3 MV/cm. Using the equation, $\Delta\Phi = L/2 \times F$, where the defect size, L, is $10^{-7}$ cm, yields a reduction to the energy of the charge barrier of 150 mV. From the ratio of the Boltzmann factors for de-trapping with and without an applied electric field, an acceleration factor of the annealing time may be calculated, i.e., $\exp(Å\Phi/kT) = \exp(-(E_t - \Delta\Phi)/kT)$ divided by $\exp(-(E_t)/kT)$, where k equals the Boltzmann constant and T equals temperature. Assuming an annealing temperature of 200° C. (473° K), the resulting acceleration, $\exp(\Delta\Phi/kT)$, is about 40, irrespective of the trap depth in the dielectric. Thus, a defect that would take about 2 hours (120 minutes) to anneal without an applied field would be accelerated by a factor of about 40 to anneal in about 3 minutes.

Referring to FIG. 3A, a flip chip package 300 may include a cover or lid 301 that encloses an integrated circuit (IC) chip or die 303, which may contact a chip carrier 309 through conductive contacts 307. The cover 301 may contact the IC chip 303, which contains a flash memory (not shown), by a thermally conductive adhesive. The conductive contacts 307, which are both thermally and electrically conductive, may comprise one of controlled collapse chip connections (C4s) and copper pillars. The volume surrounding the conductive contacts 307 between the IC chip 303 and the chip carrier 309 may be filled with a nonconductive underfill 305. The materials comprising the underfill 305, e.g., a thermoset underfill, and the chip carrier 309, e.g., an organic laminate, may typically have a lowest maximum temperature limit of about 250° C. Heating of the flip chip package 300 may be limited to a maximum temperature of about 250° C. to prevent degradation of the underfill 305 and the chip carrier 309. Heating of the IC chip 303 may be caused by Joule heating of resistive heaters 310 that may be disposed in any of: a chip carrier 309 of the flip chip package 300 that thermally contacts the IC chip 303; an attachment to the chip carrier 309 of the flip chip package 300 that thermally contacts the IC chip 303; an area of the IC chip 303 that is devoid of flash memory; a cover 301 that thermally contacts the IC chip 303 of the flip chip package 300; and an attachment to the cover 301 that thermally contacts the IC chip 303 of the flip chip package 300.

Alternatively, referring to FIG. 3B, a wire bond package 320 may include a cover or encapsulating mold compound 322 that encloses an integrated circuit (IC) chip or die 324, which may contact a chip carrier 328 through wire bonds 326. The cover 322 may contact the IC chip 324, which contains a flash memory (not shown), by a thermally conductive adhesive. The wire bonds 326 may comprise thermally and electrically conductive materials. The materials comprising the cover 322, e.g., an encapsulating thermoset mold compound, and the chip carrier 309, e.g., an organic laminate, may typically have a lowest maximum temperature limit of about 250° C. Heating of the wire bond package 320 may be limited to a maximum temperature about 250° C. to prevent degradation of the cover 305 and the chip carrier 309. Heating of the IC chip 324 may be caused by Joule heating of resistive heaters 310 that may be disposed in any of: a chip carrier 328 of the wire bond package 320 that thermally contacts the IC chip 303; an attachment to the chip carrier 328 of the wire bond package 320 that thermally contacts the IC chip 324; an area of the IC chip 324 that is devoid of the flash memory; a cover 322 that thermally contacts the IC chip 324 of the wire bond package 320; and an attachment to the cover 322 that thermally contacts the IC chip 324 of the flip chip package 320.

As stated above, erasing a flash memory cell requires application of a negative voltage between the control gate and the grounded source of the p-type doped semiconductor substrate or the grounded substrate, itself, of the flash memory cell, to pull electrons from the floating gate or charge storage layer by quantum tunneling through the tunnel dielectric to the grounded source or semiconductor substrate. A negative voltage applied to the control gate, while a positive voltage is applied to the semiconductor substrate, may also establish the negative electric field required for erasing the flash memory cell. Alternatively, a negative voltage applied to the metal layer of a flash memory cell (See, FIG. 1, 110), while either ground or a positive voltage is applied to the semiconductor substrate, may also readily establish the negative electric field required for erasing the flash memory cell.

Further, a negative electric field sufficient to pull electrons from the floating gate or charge storage layer by quantum tunneling through the tunnel dielectric to the grounded source or semiconductor substrate of each flash memory cell of a flash memory in an IC chip may be established by electrodes attached to or embedded in either the IC chip package or the IC chip.

Combined heating and application of a negative electric field across the tunnel dielectric relative to the semiconductor substrate of a flash memory cell may result in both erasing and accelerated annealing of the flash memory cell. Following the heating of the IC chip package including the IC chip with flash memory, erasing of the flash memory may be performed on a block-wise basis, where each addressed block of flash memory is subjected to a negative electric field for a time interval sufficient to both erase and anneal the flash memory cells of the addressed block of flash memory.

The application of the negative electric field to each of the blocks of flash memory, at a maximum elevated temperature of about 250° C. from the heating of the IC chip, may occur sequentially over individual blocks of flash memory for an address space that addresses all functional blocks of the flash memory. Alternatively, the application of the negative electric field to each of the blocks of flash memory, at the maximum elevated temperature of about 250° C. from the heating of the IC chip, may occur simultaneously for an address space that addresses all functional blocks of the flash memory.

The application of the negative electric field to each of the blocks of the flash memory cells may use a selectable voltage that is terminated after a selectable duration of time. Following termination of the application of the negative electric field, heating of the IC chip may also be terminated and the IC chip may be allowed to return to an ambient temperature less than that of the maximum elevated temperature.

Stored data for each of the blocks of flash memory cells may be retrieved from a storage device within the IC chip and the stored data may be rewritten into each of the blocks of flash memory cells, to recover a flash memory threshold voltage for the flash memory. The stored data that is rewritten into each of the blocks of flash memory cells may be read and verified to enable bad block management of the flash memory.

Figure 4:
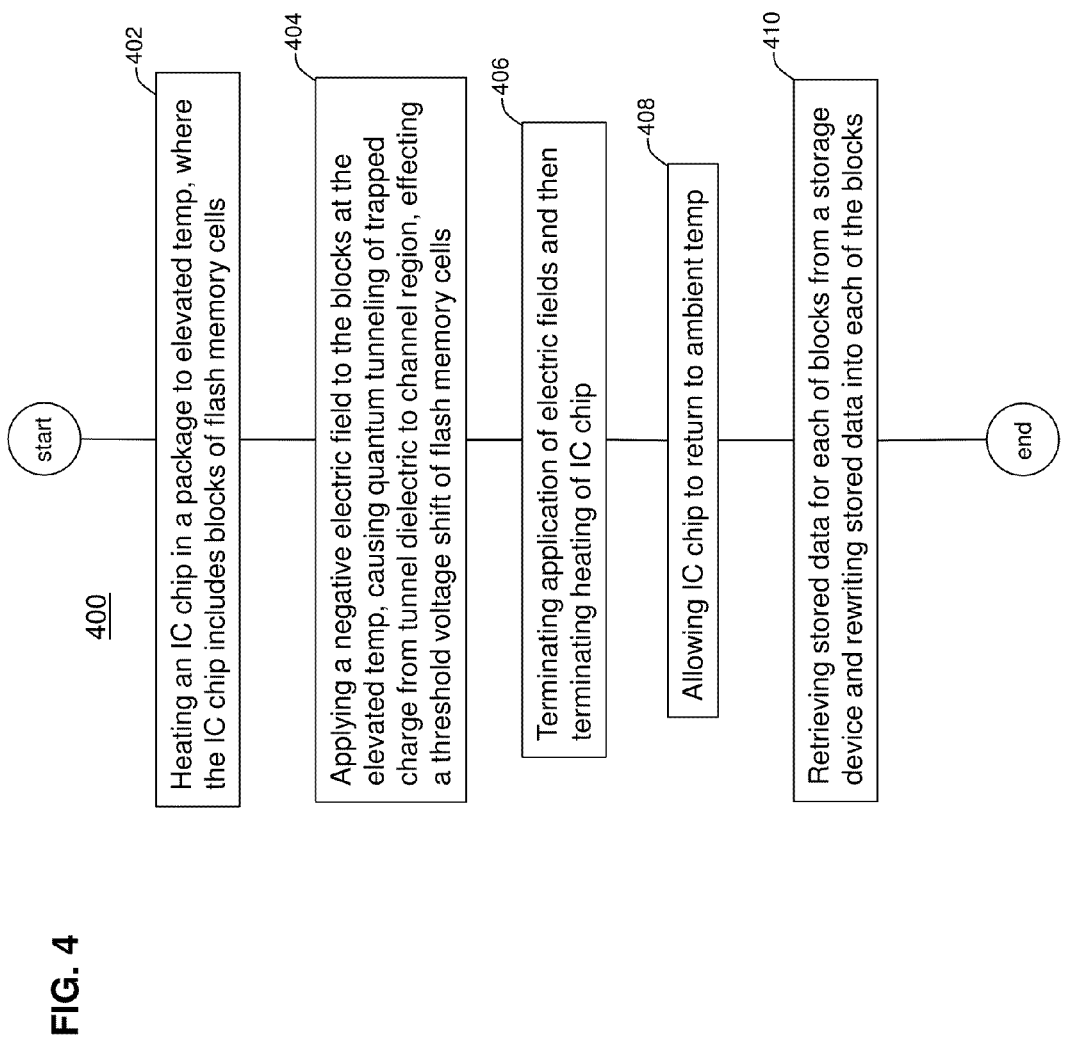
FIG. 4 is a flow diagram illustrating a method of enhancing a thermal anneal of a flash memory in an integrated circuit (IC) chip package by addition of an electric field of embodiments herein.

FIG. 4 is a flowchart 400 illustrating a method of enhancing a thermal anneal of a flash memory in an integrated circuit (IC) chip package by addition of an electric field. The method may include heating an integrated circuit (IC) chip, disposed within an IC chip package, to an elevated temperature, where the IC chip contains a flash memory that includes blocks of flash memory cells and each of the flash memory cells includes a control gate separated from a floating gate, which is separated from a channel region in a semiconductor substrate of a field effect transistor by a tunnel dielectric, 402. The method may also include applying a negative electric field to each of the blocks of flash memory cells at the elevated temperature, where the electric field causes a trapped negative charge in the tunnel dielectric to quantum tunnel to the channel region, effecting a field effect transistor threshold voltage shift of the flash memory cells, 404. The method may further include terminating application of the negative electric field to each of the blocks of flash memory cells and then terminating the heating of the IC chip, 406. The method may yet further include allowing the IC chip to return to an ambient temperature, 408. Finally, having a shifted and recovered threshold voltage, the method may include retrieving stored data for each of the blocks of flash memory cells from a storage device and rewriting the stored data into each of the blocks of flash memory cells, 410.

In the above method, the heating of the IC chip may be caused by Joule heating of a resistive element disposed in any of: a chip carrier of the IC chip package that thermally contacts the IC chip; an attachment to the chip carrier of the IC chip package that thermally contacts the IC chip; an area of the IC chip that is devoid of the flash memory; a cover that thermally contacts the IC chip of the IC chip package; and an attachment to the cover that thermally contacts the IC chip of the IC chip package. In the above method, the elevated temperature may be less than or equal to 250° C. In the above method, the electric field may be generated by one of: a voltage between the control gate and the semiconductor substrate of the field effect transistor of each of the flash memory cells; a voltage between the control gate and the metal layer of the field effect transistor of each of the flash memory cells; a voltage between a plurality of metal layers where the field effect transistor lies between the plurality of metal layers of the flash memory cells; a voltage between electrodes attached to one of: the IC chip package and the IC chip; and a voltage between electrodes embedded in one of: the IC chip package and the IC chip. The above method may further include copying data from each of the blocks of flash memory cells to the storage device prior to heating the IC chip. In the above method, the application of the negative electric field to each of the blocks of flash memory cells at the elevated temperature may occur sequentially over individual blocks of flash memory for an address space that addresses all functional blocks of the flash memory. In the above method, the application of the negative electric field to each of the blocks of flash memory cells at the elevated temperature may alternatively occur simultaneously over an address space that addresses all functional blocks of the flash memory. The above method may further include reading and verifying the stored data that is rewritten into each of the blocks of flash memory cells.

Figure 5:
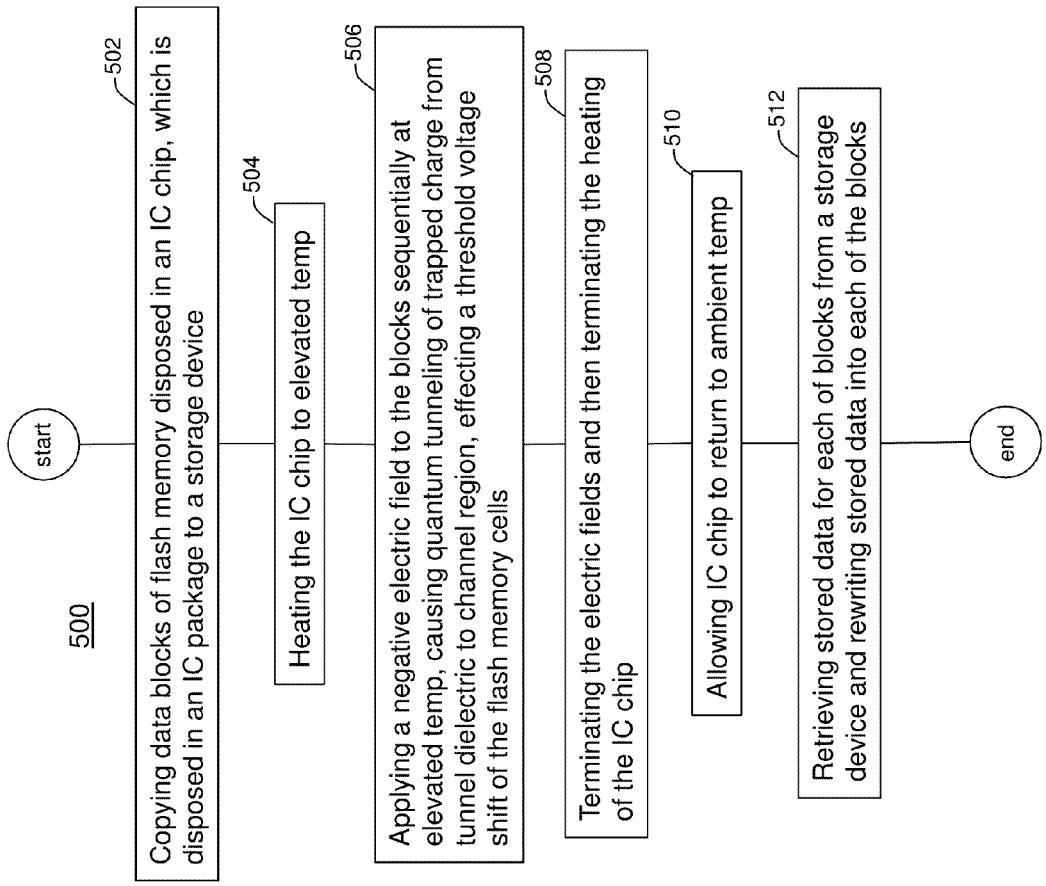
FIG. 5 is another flow diagram illustrating another method of enhancing a thermal anneal of a flash memory in an integrated circuit (IC) chip package by addition of an electric field of embodiments herein.

FIG. 5 is a flowchart 500 illustrating another method of enhancing a thermal anneal of a flash memory in an integrated circuit (IC) chip package by addition of an electric field. This method may include copying data from blocks of flash memory cells comprising a flash memory disposed within an integrated circuit (IC) chip, which is disposed within an IC chip package, to a storage device, where each of the flash memory cells includes a control gate separated from a floating gate, which is separated from a channel region in a semiconductor substrate of a field effect transistor by a tunnel dielectric, 502. The method may also include heating the IC chip to an elevated temperature, 504. The method may further include applying a negative electric field to each of the blocks of flash memory cells sequentially over individual blocks of the flash memory for an address space that addresses all functional blocks of the flash memory at the elevated temperature, where the negative electric field causes a trapped negative charge in the tunnel dielectric to quantum tunnel to the channel region, effecting a field effect transistor threshold voltage shift of the flash memory cells, 506. The method may yet further include terminating the application of the negative electric field to each of the blocks of flash memory cells and then terminating the heating of the IC chip, 508. The method may yet further include allowing the IC chip to return to an ambient temperature, 510. Finally, having a shifted and recovered threshold voltage, the method may include retrieving stored data for each of the blocks of flash memory cells from the storage device and rewriting the stored data into each of the blocks of flash memory cells, 512.

In the above method, the heating of the IC chip may be caused by Joule heating of a resistive element disposed in any of: a chip carrier of the IC chip package that thermally contacts the IC chip; an attachment to the chip carrier of the IC chip package that thermally contacts the IC chip; an area of the IC chip that is devoid of the flash memory; a cover that thermally contacts the IC chip of the IC chip package; and an attachment to the cover that thermally contacts the IC chip of the IC chip package. In the above method, the elevated temperature may be less than or equal to 250° C. In the above method, the electric field may be generated by one of: a voltage between the control gate and the semiconductor substrate of the field effect transistor of each of the flash memory cells; a voltage between the control gate and the metal layer of the field effect transistor of each of the flash memory cells; a voltage between a plurality of metal layers where the field effect transistor lies between the plurality of metal layers of the flash memory cells; a voltage between electrodes attached to one of: the IC chip package and the IC chip; and a voltage between electrodes embedded in one of: the IC chip package and the IC chip. In the above method, the negative field may be provided by a voltage ranging from −5V to −20V. In the above method, the application of the negative electric field to each of the blocks of flash memory cells at the elevated temperature sequentially over individual blocks of the flash memory may occur cyclically over multiple cycles for a selectable duration. The above method may further include reading and verifying the stored data that is rewritten into each of the blocks of flash memory cells.

Figure 6:
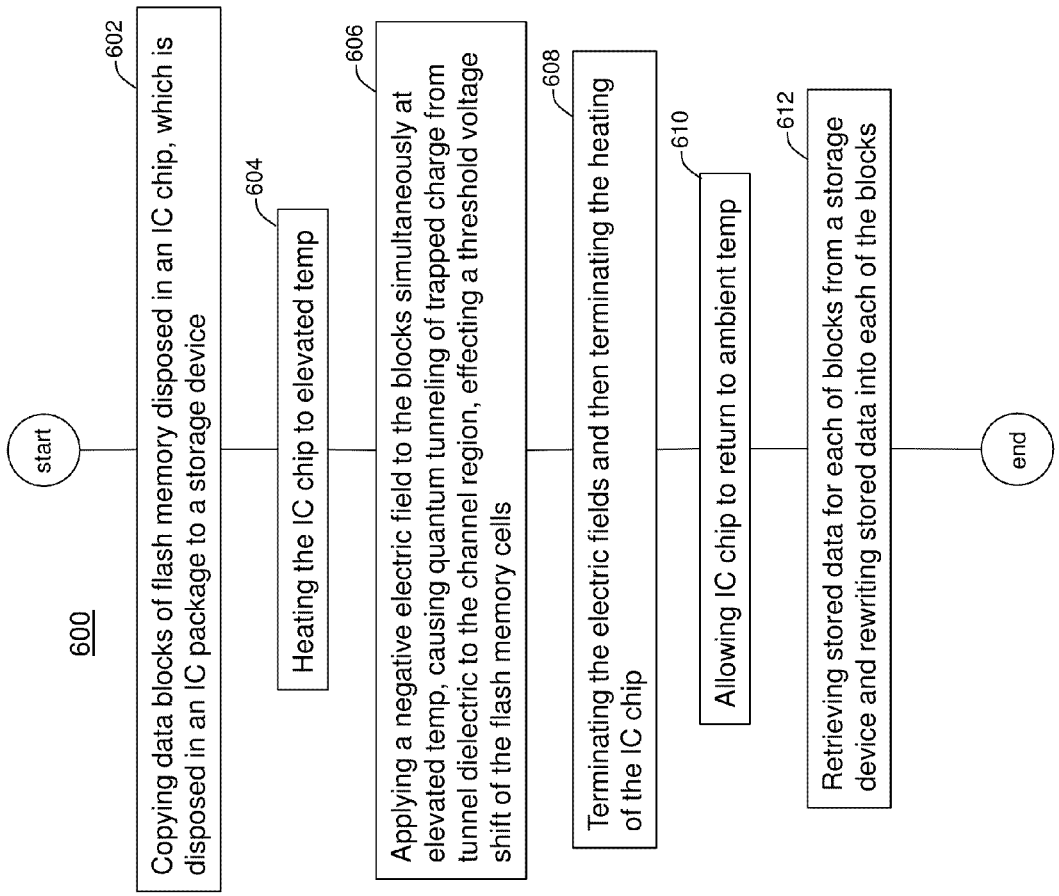
FIG. 6 is yet another flow diagram illustrating yet another method of enhancing a thermal anneal of a flash memory in an integrated circuit (IC) chip package by addition of an electric field of embodiments herein.

FIG. 6 is a flowchart 600 illustrating another method of enhancing a thermal anneal of a flash memory in an integrated circuit (IC) chip package by addition of an electric field. This method may include copying data from blocks of flash memory cells comprising a flash memory disposed within an integrated circuit (IC) chip, which is disposed within an IC chip package, to a storage device, where each of the flash memory cells includes a control gate separated from a floating gate, which is separated from a channel region in a semiconductor substrate of a field effect transistor by a tunnel dielectric, 602. The method may also include heating the IC chip to an elevated temperature, 604. The method may further include applying a negative electric field to each of the blocks of flash memory cells simultaneously over individual blocks of the flash memory for an address space that addresses all functional blocks of the flash memory at the elevated temperature, where the negative electric field causes a trapped negative charge in the tunnel dielectric to quantum tunnel to the channel region, effecting a field effect transistor threshold voltage shift of the flash memory cells, 606. The method may yet further include terminating the application of the negative electric field to each of the blocks of flash memory cells and then terminating the heating of the IC chip, 608. The method may yet further include allowing the IC chip to return to an ambient temperature, 610. Finally, having a shifted and recovered threshold voltage, the method may include retrieving stored data for each of the blocks of flash memory cells from the storage device and rewriting the stored data into each of the blocks of flash memory cells, 612.

In the above method, the heating of the IC chip may be caused by Joule heating of a resistive element disposed in any of: a chip carrier of the IC chip package that thermally contacts the IC chip; an attachment to the chip carrier of the IC chip package that thermally contacts the IC chip; an area of the IC chip that is devoid of the flash memory; a cover that thermally contacts the IC chip of the IC chip package; and an attachment to the cover that thermally contacts the IC chip of the IC chip package. In the above method, the elevated temperature may be less than or equal to 250° C. In the above method, the electric field may be generated by one of: a voltage between the control gate and the semiconductor substrate of the field effect transistor of each of the flash memory cells; a voltage between the control gate and the metal layer of the field effect transistor of each of the flash memory cells; a voltage between a plurality of metal layers where the field effect transistor lies between the plurality of metal layers of the flash memory cells; a voltage between electrodes attached to one of: the IC chip package and the IC chip; and a voltage between electrodes embedded in one of: the IC chip package and the IC chip. In the above method, the negative field may be provided by a voltage ranging from −5V to −20V. In the above method, the application of the negative electric field to each of the blocks of flash memory cells at the elevated temperature simultaneously over individual blocks of the flash memory may occur cyclically over multiple cycles for a selectable duration. The above method may further include reading and verifying the stored data that is rewritten into each of the blocks of flash memory cells.

The methods as described above are used in the fabrication of an integrated circuit chip mounted in a single chip package.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can comprise, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of SiO2 and Si3N4, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can comprise any material appropriate for the given purpose (whether now known or developed in the future) and can comprise, for example, Si, SiC, SiGe, SiGeC, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
heating an integrated circuit (IC) chip, disposed within an IC chip package, to an elevated temperature, said integrated circuit (IC) chip including a flash memory that includes blocks of flash memory cells, each of said flash memory cells including a control gate separated from a floating gate, which is separated from a channel region in a semiconductor substrate of a field effect transistor by a tunnel dielectric;
applying a negative electric field to each of said blocks of flash memory cells at said elevated temperature, said negative electric field causing a trapped negative charge in said tunnel dielectric to quantum tunnel to said channel region, effecting a field effect transistor threshold voltage shift of said flash memory cells;
terminating said applying of said negative electric field to each of said blocks of flash memory cells and then terminating said heating of said integrated circuit (IC) chip;
allowing said integrated circuit (IC) chip to return to an ambient temperature; and
retrieving data for each of said blocks of flash memory cells from a storage device and rewriting said data into each of said blocks of flash memory cells.

2. The method of claim 1, said heating of said integrated circuit (IC) chip being caused by Joule heating of a resistive element disposed in any of: a chip carrier of said IC chip package that thermally contacts said integrated circuit (IC) chip; an attachment to said chip carrier of said IC chip package that thermally contacts said integrated circuit (IC) chip; an area of said integrated circuit (IC) chip that is devoid of said flash memory; a cover that thermally contacts said integrated circuit (IC) chip of said IC chip package; and an attachment to said cover that thermally contacts said integrated circuit (IC) chip of said IC chip package.

3. The method of claim 1, said elevated temperature being less than or equal to 250° C.

4. The method of claim 1, said negative electric field being generated by one of: a voltage between said control gate and said semiconductor substrate of said field effect transistor of each of said flash memory cells; a voltage between said control gate and a metal layer of said field effect transistor of each of said flash memory cells; a voltage between a plurality of metal layers where said field effect transistor lies between said plurality of metal layers of said flash memory cells; a voltage between electrodes attached to one of said IC chip package and said integrated circuit (IC) chip; and a voltage between electrodes embedded in one of said IC chip package and said integrated circuit (IC) chip.

5. The method of claim 1, further comprising copying data from each of said block of flash memory cells to said storage device prior to heating said integrated circuit (IC) chip.

6. The method of claim 1, said applying of said negative electric field to each of said blocks of flash memory cells at said elevated temperature occurring sequentially over individual blocks of flash memory for an address space that addresses all functional blocks of said flash memory.

7. The method of claim 1, said applying of said negative electric field to each of said blocks of flash memory cells at said elevated temperature occurring simultaneously over an address space that addresses all functional blocks of said flash memory.

8. A method comprising:
copying data from blocks of flash memory cells comprising a flash memory disposed within an integrated circuit (IC) chip, which is disposed within an IC chip package, to a storage device, each of said flash memory cells including a control gate separated from a floating gate, which is separated from a channel region in a semiconductor substrate of a field effect transistor by a tunnel dielectric;
heating said integrated circuit (IC) chip to an elevated temperature;
applying a negative electric field to each of said blocks of flash memory cells sequentially over individual blocks of said flash memory for an address space that addresses all functional blocks of said flash memory at said elevated temperature, said negative electric field causing a trapped negative charge in said tunnel dielectric to quantum tunnel to said channel region, effecting a field effect transistor threshold voltage shift of said flash memory cells;
terminating said applying of said negative electric field to each of said blocks of flash memory cells and then terminating said heating of said integrated circuit (IC) chip;
allowing said integrated circuit (IC) chip to return to an ambient temperature; and
retrieving data for each of said blocks of flash memory cells from said storage device and rewriting said data into each of said blocks of flash memory cells.

9. The method of claim 8, said heating of said integrated circuit (IC) chip being caused by Joule heating of a resistive element disposed in any of: a chip carrier of said IC chip package that thermally contacts said integrated circuit (IC) chip; an attachment to said chip carrier of said IC chip package that thermally contacts said integrated circuit (IC) chip; an area of said integrated circuit (IC) chip that is devoid of said flash memory; a cover that thermally contacts said integrated circuit (IC) chip of said IC chip package; and an attachment to said cover that thermally contacts said integrated circuit (IC) chip of said IC chip package.

10. The method of claim 8, said elevated temperature being less than or equal to 250° C.

11. The method of claim 8, said negative electric field being generated by one of: a voltage between said control gate and said semiconductor substrate of said field effect transistor of each of said flash memory cells; a voltage between said control gate and a metal layer of said field effect transistor of each of said flash memory cells; a voltage between a plurality of metal layers where said field effect transistor lies between said plurality of metal layers of said flash memory cells; a voltage between electrodes attached to one of said IC chip package and said integrated circuit (IC) chip; and a voltage between electrodes embedded in one of said IC chip package and said integrated circuit (IC) chip.

12. The method of claim 8, said negative electric field being provided by a voltage ranging from −5V to −20V.

13. The method of claim 8, said applying of said negative electric field to each of said blocks of flash memory cells at said elevated temperature sequentially over individual blocks of said flash memory occurring cyclically over multiple cycles for a selectable duration.

14. A method comprising:
copying data from blocks of flash memory cells comprising a flash memory disposed within an integrated circuit (IC) chip, which is disposed within an IC chip package, to a storage device, each of said flash memory cells including a control gate separated from a floating gate, which is separated from a channel region in a semiconductor substrate of a field effect transistor by a tunnel dielectric;
heating said integrated circuit (IC) chip to an elevated temperature;
applying a negative electric field to each of said blocks of flash memory cells simultaneously over individual blocks of said flash memory for an address space that addresses all functional blocks of said flash memory at said elevated temperature, said negative electric field causing a trapped negative charge in said tunnel dielectric to quantum tunnel to said channel region, effecting a field effect transistor threshold voltage shift of said flash memory cells;
terminating said applying of said negative electric field to each of said blocks of flash memory cells and then terminating said heating of said integrated circuit (IC) chip;
allowing said integrated circuit (IC) chip to return to an ambient temperature; and
retrieving data for each of said blocks of flash memory cells from said storage device and rewriting said data into each of said blocks of flash memory cells.

15. The method of claim 14, said heating of said integrated circuit (IC) chip being caused by Joule heating of a resistive element disposed in any of: a chip carrier of said IC chip package that thermally contacts said integrated circuit (IC) chip; an attachment to said chip carrier of said IC chip package that thermally contacts said integrated circuit (IC) chip; an area of said integrated circuit (IC) chip that is devoid of said flash memory; a cover that thermally contacts said integrated circuit (IC) chip of said IC chip package; and an attachment to said cover that thermally contacts said integrated circuit (IC) chip of said IC chip package.

16. The method of claim 14, said elevated temperature being less than or equal to 250° C.

17. The method of claim 14, said negative electric field being generated by one of: a voltage between said control gate and said semiconductor substrate of said field effect transistor of each of said flash memory cells; a voltage between said control gate and a metal layer of said field effect transistor of each of said flash memory cells; a voltage between a plurality of metal layers where said field effect transistor lies between said plurality of metal layers of said flash memory cells; a voltage between electrodes attached to one of said IC chip package and said integrated circuit (IC) chip; and a voltage between electrodes embedded in one of said IC chip package and said integrated circuit (IC) chip.

18. The method of claim 14, said negative electric field ranging from −5V to −20V.

19. The method of claim 14, said applying of said negative electric field to each of said blocks of flash memory cells at said elevated temperature simultaneously over individual blocks of said flash memory occurring cyclically over multiple cycles for a selectable duration.

20. The method of claim 14 further comprising reading and verifying said data that is rewritten into each of said blocks of flash memory cells.

* * * * *